(12) United States Patent
Nishimura et al.

(10) Patent No.: US 8,860,189 B2
(45) Date of Patent: Oct. 14, 2014

(54) PIN DIODE

(75) Inventors: Yoshikazu Nishimura, Osaka (JP);
Hirofumi Yamamoto, Osaka (JP);
Takeyoshi Uchino, Osaka (JP)

(73) Assignee: Sansha Electric Manufacturing Co., Ltd., Osaka (JP)

( * ) Notice: Subject to any disclaimer, the term of this patent is extended or adjusted under 35 U.S.C. 154(b) by 20 days.

(21) Appl. No.: 13/520,357

(22) PCT Filed: Feb. 17, 2010

(86) PCT No.: PCT/JP2010/052306
§ 371 (c)(1),
(2), (4) Date: Jul. 3, 2012

(87) PCT Pub. No.: WO2011/101958
PCT Pub. Date: Aug. 25, 2011

(65) Prior Publication Data
US 2012/0299163 A1    Nov. 29, 2012

(30) Foreign Application Priority Data

Feb. 17, 2010   (JP) ................................. 2010-031957

(51) Int. Cl.
*H01L 29/66* (2006.01)
*H01L 29/06* (2006.01)
*H01L 29/868* (2006.01)

(52) U.S. Cl.
CPC .......... *H01L 29/868* (2013.01); *H01L 29/0615* (2013.01); *H01L 29/0692* (2013.01); *H01L 29/6609* (2013.01); *H01L 29/0619* (2013.01); *H01L 29/0638* (2013.01)
USPC ........................................................ 257/656

(58) Field of Classification Search
CPC ............ H01L 29/0692; H01L 29/0638; H01L 29/0615; H01L 29/0619

USPC ......................................................... 257/656
See application file for complete search history.

(56) References Cited

U.S. PATENT DOCUMENTS 7,119,379 B2 * 10/2006 Ninomiya et al. ............ 257/107
2003/0209774 A1 * 11/2003 Jimbo et al. .................. 257/488

(Continued)

FOREIGN PATENT DOCUMENTS

| JP | 01-095568 | 4/1989 |
| JP | 06-244405 | 9/1994 |

(Continued)

OTHER PUBLICATIONS

International Search Report issued by the Japanese Patent Office in corresponding International Patent Application No. PCT/US2010/052306 dated May 18, 2010 (2 pages).

(Continued)

*Primary Examiner* — Anthony Ho
(74) *Attorney, Agent, or Firm* — Kilyk & Bowersox, P.L.L.C.

(57) ABSTRACT

Provided is a PIN diode that can suppress thermal destruction from occurring at the time of a reverse bias exceeding a breakdown voltage by current concentration on a curved part of an anode region. The PIN diode is configured to have: a semiconductor substrate 11 that includes an $N^+$ semiconductor layer 1 and an $N^-$ semiconductor layer 2; a cathode electrode 18 that is formed on an outer surface of the $N^+$ semiconductor layer 1; a main anode region 16, a separated anode region 15, and an anode connecting region that are formed by selectively diffusing P-type impurities from an outer surface of the $N^-$ semiconductor layer 2; and an anode electrode 17 that is formed on the main anode region 16.

5 Claims, 13 Drawing Sheets

(56) References Cited

U.S. PATENT DOCUMENTS

| | | | |
|---|---|---|---|
| 2008/0135926 A1* | 6/2008 | Ono et al. | 257/328 |
| 2009/0101974 A1* | 4/2009 | Saito et al. | 257/342 |
| 2009/0236697 A1* | 9/2009 | Ono et al. | 257/618 |
| 2010/0230745 A1* | 9/2010 | Saito et al. | 257/329 |

FOREIGN PATENT DOCUMENTS

| | | |
|---|---|---|
| JP | 07-221290 | 8/1995 |
| JP | 07-221326 | 8/1995 |
| JP | 10-022395 | 1/1998 |
| JP | 10-335679 | 12/1998 |
| JP | 11-040822 | 2/1999 |
| JP | 2000-022176 | 1/2000 |
| JP | 2002-203955 | 7/2002 |
| JP | 2002-246609 | 8/2002 |
| JP | 2002-270857 | 9/2002 |
| JP | 2004-247456 | 9/2004 |
| JP | 2006-269633 | 10/2006 |
| JP | 2009-164486 | 7/2009 |

OTHER PUBLICATIONS

U.S. Appl. No. 13/520,361, filed Jul. 3, 2012.

* cited by examiner

A1-A1 CROSS SECTION

A2-A2 CROSS SECTION (a)

(b)

(c)

(a) SHAPE OF ANODE CONNECTING REGION (b) CONCENTRATION GRADIENT ON CURRENT PATH (a)

(b)

(c)

CONVENTIONAL EXAMPLE

CONVENTIONAL EXAMPLE

PIN DIODE

This application is a National Stage Application of PCT/JP2010/052306, filed Feb. 17, 2010, which claims the priority of Japanese Patent Application No. 2010-031957, which is incorporated herein by reference.

FIELD OF THE INVENTION

The present invention relates to a PIN (P Intrinsic N) diode, and more particularly to improvement of a PIN diode in order to improve avalanche resistance.

BACKGROUND ART

As a semiconductor rectifier element in which on one principal surface of a semiconductor substrate including an N-type semiconductor layer, a cathode electrode is formed, and on the other principal surface, a rectangular-shaped anode region including a P-type semiconductor is formed, there is a PIN diode. The PIN diode achieves good breakdown voltage characteristics with respect to a reverse bias in such a way that the N-type semiconductor layer includes an $N^+$ semiconductor layer and an $N^-$ semiconductor layer (intrinsic semiconductor layer) having lower impurity concentration than impurity concentration of the $N^+$ semiconductor layer, and the $N^-$ semiconductor layer having high resistance is present between the anode region and the $N^+$ semiconductor layer.

As a breakdown phenomenon that occurs when a reverse bias is applied, there is avalanche breakdown (electron avalanche breakdown). The avalanche breakdown occurs when a reverse bias exceeding a breakdown voltage (reverse breakdown voltage) is applied, and a temperature rise due to a large avalanche current flow may lead to thermal destruction of the element. It is known that a depletion layer that is generated in the $N^-$ semiconductor layer by applying a reverse bias is unlikely to extend in an end part of the anode region as compared with a central part of the anode region. That is, a thickness of the depletion layer is small in the end part of the anode region as compared with the central part, which is likely to give rise to electric field concentration, and therefore the above-described avalanche breakdown is likely to occur in the end part of the anode region. For this reason, there is proposed a technique that, by forming an annular P-type region surrounding the anode region, reduces the electric field concentration in the end part of the anode region to thereby improve avalanche resistance (see, for example, Patent Literatures 1 and 2).

FIG. 11 is a plan view illustrating a configuration example of a conventional PIN diode 100, in which an anode region 105 is surrounded by a plurality of FLRs 104. FIG. 12 illustrates a cross section cut by an A10-A10 section line in FIG. 11. FIG. 13 is a cross-sectional view of the PIN diode without any FLR 104.

In the PIN diode 100, on one principal surface of a semiconductor substrate 101, a cathode electrode 110 is formed, and on the other principal surface, an anode region 105, two FLRs 104, and a stopper region 111 are formed. Each of the FLRs (Field Limiting Rings) 104 is an annular region that is formed along an outer edge of the anode region 105 and includes a P-type semiconductor, and referred to as a guard ring. The stopper region 111 is an annular region that is formed in a circumferential edge part of the semiconductor substrate 101 and includes an $N^+$ semiconductor.

On the anode region 105, an anode electrode 106 is formed, and from a circumferential edge part of the anode region 105 to the stopper region 111, an oxide film 103 is formed. The oxide film 103 is an insulating film having an annular region, and the anode electrode 106 is formed with overlapping with an inner edge part of the oxide film 103, whereas with overlapping with an outer edge part, an annular equipotential electrode 102 is formed. The semiconductor substrate 101 includes an $N^+$ semiconductor layer 101a and an $N^-$ semiconductor layer 101b, and by selectively diffusing P-type impurities from a surface of the $N^-$ semiconductor layer 101b, the anode region 105 and the FLRs 104 are formed.

In the case where the FLRs 104 are not provided, a depletion layer 112 formed by applying a reverse bias is tabular (planar plane) in a central part of the anode region 105, whereas in an end part B11 of the anode region 105, the depletion layer 112 is cylindrical. For this reason, in particular, in the end part B11 of a curved part B10, electric field concentration occurs, and thereby avalanche breakdown is likely to occur. On the other hand, in the case where the FLRs 104 are provided, the depletion layer 112 extends from the end part B11 of the anode region 105 toward an outer edge of the semiconductor substrate 101. That is, the depletion layer 112 extending from the end part B11 of the anode region 105 reaches the FLRs 104, and further extends toward the outside from there, and thereby an electric field in the end part B11 of the anode region 105 is reduced. Also, each of the FLRs 104 is electrically isolated from the anode region 105 or the other FLR 104, and therefore between the anode region 105 and the FLR 104, or between the FLRs 104, a voltage drop occurs toward the outside, so that in the FLR 104 parts, electric field concentration is unlikely to occur.

In general, when a surge voltage generated by an external cause such as an inductive load or leakage inductance due to primary-secondary coupling of a transformer exceeds a breakdown voltage, an avalanche current flows in an element. At this time, avalanche breakdown occurs from a location where an electric field is most concentrated in the element. For this reason, in the above-described PIN diode 100, the electric field concentration occurs in the curved part B10 at the outer edge of the anode region 105, and avalanche current flows to easily give rise to thermal destruction, so that there is a limitation in improving avalanche resistance.

According to a conventional technique search by the present inventors, it turns out that as a technique that improves avalanche resistance of a semiconductor device, there are: (1) a method that increases a P-type impurity diffusion depth; (2) a method that controls impurity concentration by multiple diffusion or ion implantation (e.g., Patent Literatures 1 and 3 to 9); (3) a method that forms a highly resistive film on a chip surface (e.g., Patent Literatures 2 and 10); and (4) a method that, outside an anode region, forms a plurality of annular regions having low impurity concentration (e.g., Patent Literature 1). The method (1) is one that, by increasing the diffusion depth at the time of diffusing P-type impurities to form an anode region, reduces electric field concentration in an end part of the anode region, but cannot prevent an electric field from being concentrated in a curved part of the anode region. Also, to increase the diffusion depth, time necessary for a diffusion process is increased, which gives rise to a problem of reducing productivity.

The method (2) is one that, by implanting ions that can serve as N-type impurities, such as phosphorous, arsenic, or antimony, into a surface part of a high concentration P layer to the extent of not exceeding P-type impurity concentration, or directly performing ion implantation of P-type impurities at low concentration, forms a highly resistive layer having reduced impurity concentration in an end part of an anode region, and the presence of the highly resistive layer prevents avalanche current from being attracted to a surface layer. This method cannot be also prevent an electric field from being concentrated in a curved part of the anode region, and requires an ion implantation process, which gives rise to a problem of reducing productivity. The method (3) is one in which an anode electrode is configured to have a plurality of electrodes that are mutually separated, and a connection between the electrodes is made by a highly resistive film, and a larger voltage drop at an outer electrode is used to reduce electric field concentration in an end part of an anode region. This method cannot be also prevent an electric field from being concentrated in a curved part of the anode region, and requires complicated patterning for forming the plurality of electrodes and also a process of forming the highly resistive film, and therefore there arises a problem of reducing productivity.

The method (4) is one that, outside the anode region, forms the plurality of annular regions having low impurity concentration such that the plurality of annular region overlap with each other in a surface part of a P layer, and thereby forms a resistive layer in an end part of the anode region. In this method, if avalanche breakdown occurs in a curved part of the anode region, avalanche current linearly flows toward an anode electrode through the resistive layer. At this time, the avalanche current flows with spreading, so that a sufficient voltage drop cannot be obtained, and therefore the avalanche breakdown continuously occurs at the same location. For this reason, the method (4) cannot prevent the curved part of the anode region from being thermally destroyed by the concentration of the avalanche current. Also, this method requires an ion implantation process for forming the annular regions having low concentration, and therefore there arises a problem of reducing productivity. Further, in the method (4), in the case of, in the curved part of the anode region, attempting to increase a resistance component in a direction toward the outside, more annular regions should be formed, and therefore there arises a problem of decreasing an effective chip area.

CONVENTIONAL TECHNIQUE DOCUMENT

Patent Literature

Patent Literature 1: JPA 2002-270857
Patent Literature 2: JPA 2000-22176
Patent Literature 3: JPA 2009-164486
Patent Literature 4: JPA 2004-247456
Patent Literature 5: JPA 2002-246609
Patent Literature 6: JPA 2002-203955
Patent Literature 7: JPA H10-335679
Patent Literature 8: JPA H07-221326
Patent Literature 9: JPA H07-221290
Patent Literature 10: JPA H11-040822

DISCLOSURE OF THE INVENTION

Problems to be Solved by the Invention

The present invention is made in consideration of the above situations, and an object thereof is to improve avalanche resistance of a PIN diode. In particular, an object of the present invention is to suppress thermal destruction from occurring at the time of a reverse bias exceeding a breakdown voltage by current concentration on a curved part of an anode region. Also, an object of the present invention is to suppress the thermal destruction from occurring due to continuous current concentration on one point in a linear part of the anode region at the time of the reverse bias exceeding the breakdown voltage. Further, an object of the present invention is to improve the avalanche resistance of the PIN diode without complicating a manufacturing process.

Means Adapted to Solve the Problems

A PIN diode according to a first aspect of the present invention is provided with: a semiconductor substrate that includes an N-type first semiconductor layer, and an N-type second semiconductor layer having lower impurity concentration than impurity concentration of the first semiconductor layer; a cathode electrode that is formed on an outer surface of the first semiconductor layer; a main anode region, a separated anode region, and an anode connecting region that are formed by selectively diffusing a P-type impurity from an outer surface of the second semiconductor layer; and an anode electrode that is formed on the anode region, wherein: the main anode region has four sides that are respectively adapted to be linear parts, and has a substantially rectangular outer edge having four vertices that are respectively adapted to be substantially arc-like curved parts; the separated anode region is annularly formed along the outer edge of the main anode region; and the anode connecting region is adapted to have a shape that is formed by protruding any one of an inner edge of the separated anode region and any of the linear parts to bring the any one into point contact with the other one, the inner edge and the linear parts being facing to each other.

In this PIN diode, the main anode region having the substantially rectangular outer edge and the separated anode region formed along the outer edge of the main anode region are connected to each other through the anode connecting region, and therefore the main anode region and the separated anode region are at the same potential. In such a configuration, if a reverse bias exceeding a breakdown voltage is applied, first avalanche breakdown occurs in a corner part of the separated anode region, which corresponds to any one of the curved parts of the main anode region. If the avalanche breakdown occurs in the corner part of the separated anode region, avalanche current flowing from a location of the breakdown to the anode electrode cannot linearly flow from the corner part of the separated anode region toward the main anode region because between the separated anode region and the main anode region, the second semiconductor layer having the lower impurity concentration intervenes.

For this reason, the avalanche current flows along the separated anode region, and flows into the main anode region through the anode connecting region. If the avalanche current flows through such a path, a resistance component of the path gives rise to a voltage drop to increase a potential at the breakdown location, and therefore the breakdown location moves to a lower potential site. The breakdown location moves in this manner, so that the location where the avalanche current flows to thereby raise temperature is distributed, and therefore the occurrence of thermal destruction can be suppressed. In particular, the anode connecting region has the shape that is adapted to be in point contact with any one of the main anode region and the separated anode region, so that resistance of the anode connecting region can be increased, and therefore the movement of the breakdown location using the voltage drop can be effectively made.

A PIN diode according to a second aspect of the present invention is, in addition to the above configuration, configured such that the anode connecting region is adapted to have a triangular shape having a width that is decreased depending on a distance from the any one of the inner edge of the separated anode region and the any of the linear parts. Such a configuration enables the resistance of the anode connecting region to be increased to effectively make the movement of the breakdown location using the voltage drop without increasing manufacturing cost. For example, higher accuracy than before is not required for patterning of the anode connecting region, or an increase in chip area caused by increasing a length of the anode connection region is not also made.

A PIN diode according to a third aspect of the present invention is, in addition to the above configuration, configured such that the anode connecting region has an arc-like outer shape having a width that is decreased depending on a distance from the any one of the inner edge of the separated anode region and the any of the linear parts. Such a configuration enables the resistance of the anode connecting region to be increased to effectively make the movement of the breakdown location using the voltage drop without increasing the manufacturing cost.

A PIN diode according to a fourth aspect of the present invention is, in addition to the above configuration, configured such that, for each of the linear parts, two or more the anode connecting regions are arranged at regular intervals. Such a configuration enables the avalanche current flowing along the separated anode region to be distributed to the respective anode connecting regions. Further, if the breakdown location moves from the corner part of the separated anode region to the linear part by the increase in potential at the breakdown location, the avalanche current can be equally flowed into the anode connecting regions from the new breakdown location. That is, even after the potential at the avalanche breakdown occurrence location has been increased by the voltage drop due to the resistance component of the current path, and the breakdown location has been moved by the potential increase, the same phenomenon occurs and thereby the movement of the breakdown location is repeated.

A PIN diode according to a fifth aspect of the present invention is, in addition to the above configuration, configured such that a concentration gradient that minimizes impurity concentration on the outer surface of the second semiconductor layer is formed on a current path from the separated anode region to the main anode region through the anode connecting region. According to such a configuration, the resistance component at the time when the avalanche current turns toward the anode connecting region can be increased to thereby effectively give rise to the voltage drop. In particularly, by increasing the resistance component on the basis of the concentration gradient, the desired resistance component can be obtained without increasing the patterning accuracy at the time of the impurity diffusion.

A PIN diode according to a sixth aspect of the present invention is, in addition to the above configuration, configured such that the concentration gradient is formed by making exposed regions of the second semiconductor layer upon impurity diffusion discontinuous. Such a configuration enables the concentration gradient on the current path from the separated anode region to the main anode region to be easily formed.

Effects of the Invention

According to the PIN diode according to the present invention, if the avalanche breakdown occurs in the corner part of the separated anode region, the avalanche current flows along the separated anode region and turns toward the anode connecting region, so that the potential at the breakdown location is increased by the resistance component of the path, and therefore the breakdown location moves to the lower potential site. The breakdown location moves in this manner, so that the location where the avalanche current flows with being concentrated and thereby temperature is raised is distributed, and therefore the occurrence of thermal destruction can be suppressed. Accordingly, the corner part of the anode region can be suppressed from being thermally destroyed by the avalanche current, and therefore the PIN diode having improved avalanche resistance can be achieved.

Also, the above configuration enables the corner part of the separated anode region to be suppressed from being thermally destroyed by the concentration of the avalanche current; however, not only in the corner part, but also in any of the linear parts of the separated anode region, current concentration is suppressed by the same phenomenon, and therefore the avalanche resistance is improved also by suppressing the linear part from being thermally destroyed by the concentration of the avalanche current.

BEST MODE FOR CARRYING OUT THE INVENTION

Figure 1:
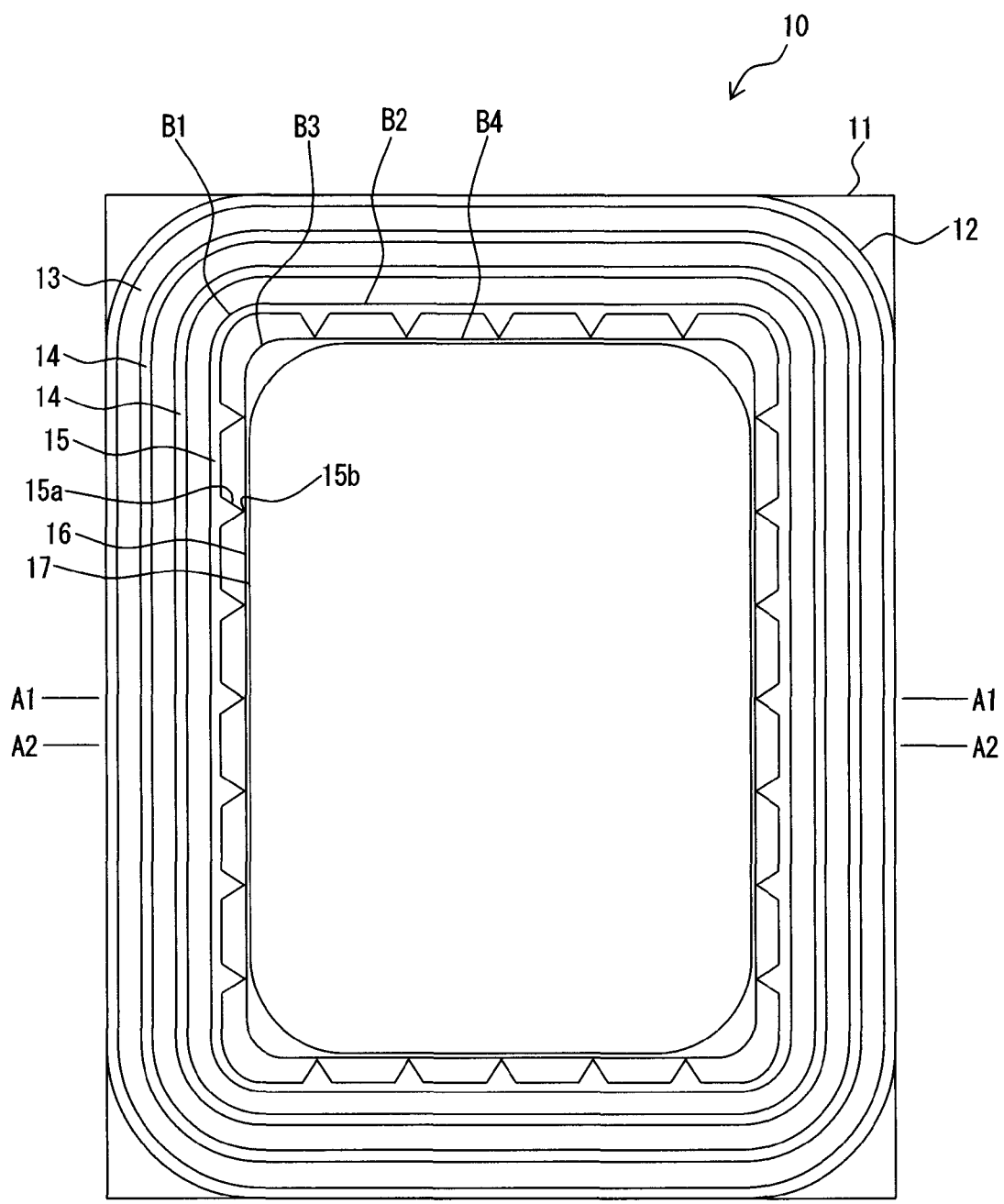
FIG. 1 is a plan view illustrating a configuration example of a PIN diode according to a first embodiment of the present invention.

First embodiment
<Planar Layout of PIN Diode>
FIG. 1 is a plan view illustrating a configuration example of a PIN diode according to a first embodiment of the present invention. A PIN diode 10 is a semiconductor rectifier element including respective semiconductor layers of P-I-N, and for examples, as an FRD (Fast Recovery Diode), used for a power converter or the like.

In the PIN diode 10, on one principal surface of a semiconductor substrate 11, two FLRs 14, a separated anode region 15, a plurality of protruding parts 15a, and a main anode region 16 are formed. The main anode region 16 is an anode region including a P-type semiconductor, and on the region, a substantially rectangular shaped anode electrode 17 is formed. The main anode region 16 has a substantially rectangular outer edge of which four sides are adapted to be linear parts B4 and four vertices are adapted to be substantially arc-like curved parts B3, respectively.

The separated anode region 15 is a P-type anode region that is annularly formed along the outer edge of the main anode region 16. Each of the protruding parts 15a is an anode connecting region for making a connection between the separated anode region 15 and the main anode region 16, and adapted to have a shape that is formed by protruding an inner edge of the separated anode region 15 to bring the inner edge into point contact with a corresponding one of the linear parts B4 of the main anode region 16.

The respective protruding parts 15a are P-type anode regions, and formed in parts other than corner parts B1 of the separated anode region 15. In this example, two or more protruding parts 15a are arranged at predetermined intervals for each of the linear parts B4 of the main anode region 16. Also, such protruding parts 15a are formed in four linear parts B2 of the separated anode region 15. The separated anode region 15 is conducted to the main anode region 16 through connecting parts 15b respectively formed at fore ends of the protruding parts 15a, and therefore the anode region having the same potential as that of the main anode region 16.

Each of the FLRs 14 is an annular break down voltage holding region that is formed along an outer edge of the separated anode region 15 and includes a P-type semiconductor. In a circumferential edge part of the semiconductor substrate 11, an annular equipotential electrode 12 that surrounds the FLRs 14 is formed.

<Cross-Sectional Structure>

Figure 2:
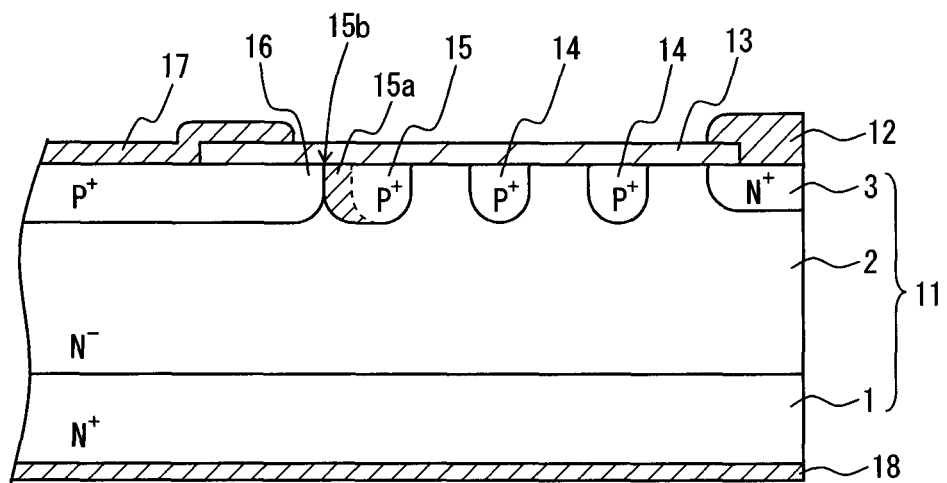
FIG. 2 is a cross-sectional view based on an A1-A1 section line in FIG. 1.
Figure 3:
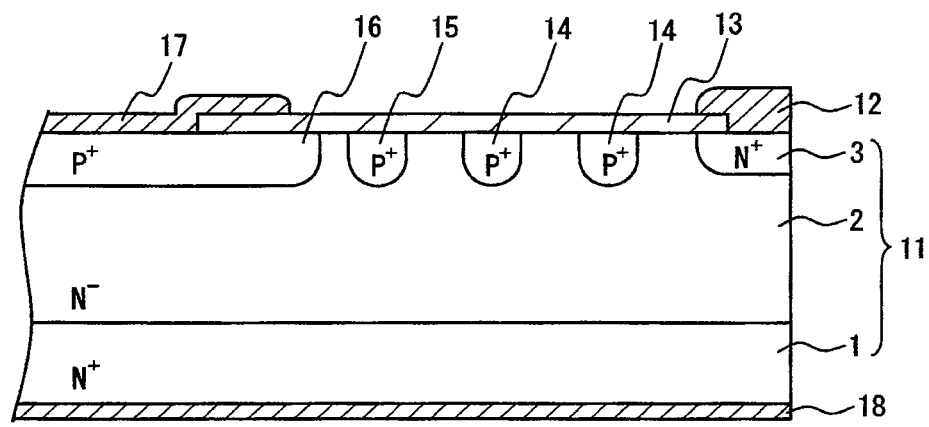
FIG. 3 is a cross-sectional view based on an A2-A2 section line in FIG. 1.

FIG. 2 is a cross-sectional view based on an A1-A1 section line in FIG. 1, in which a cross section including the protruding part 15a provided in the separated anode region 15 is illustrated. Also, FIG. 3 is a cross-sectional view based on an A2-A2 section line in FIG. 1, in which a cross section not including any protruding part 15a is illustrated.

In the PIN diode 10, on a lower side principal surface of the semiconductor substrate 11, a cathode electrode 18 is formed, and on the upper side principal surface, the main anode region 16, separated anode region 15, FLRs 14, and stopper region 3 are formed.

On the main anode region 16, the anode electrode 17 is formed, and from a circumferential edge part of the main anode region 16 to the stopper region 3, an oxide film 13 is formed. The oxide film 13 is an insulating film having an annular region, and made of, for example, $SiO_2$ (silicon dioxide). The anode electrode 17 is formed with overlapping with an inner edge part of the oxide film 13, and the equipotential electrode 12 is formed with overlapping with an outer edge part of the oxide film 13.

The semiconductor substrate 11 includes an $N^+$ semiconductor layer 1 and an $N^-$ semiconductor layer 2, and by selectively diffusing P-type impurities from an outer surface of the $N^-$ semiconductor layer 2, i.e., from the upper side principal surface of the semiconductor substrate 11, the main anode region 16, separated anode region 15, protruding parts 15a, and FLRs 14 are formed. The stopper region 3 is an annular region that is formed in the circumferential edge part of the semiconductor substrate 11 and includes an $N^+$ semiconductor. The $N^-$ semiconductor layer 2 is a semiconductor layer of which impurity concentration is sufficiently low as compared with the $N^+$ semiconductor layer 1 or main anode region 16.

In the protruding parts 15a, the main anode region 16 and the separated anode region 15 are electrically connected to each other through the resistance components, and therefore the main anode region 16 and the separated anode region 15 are at the same potential.

<Corner Part of Anode Region>

Figure 4:
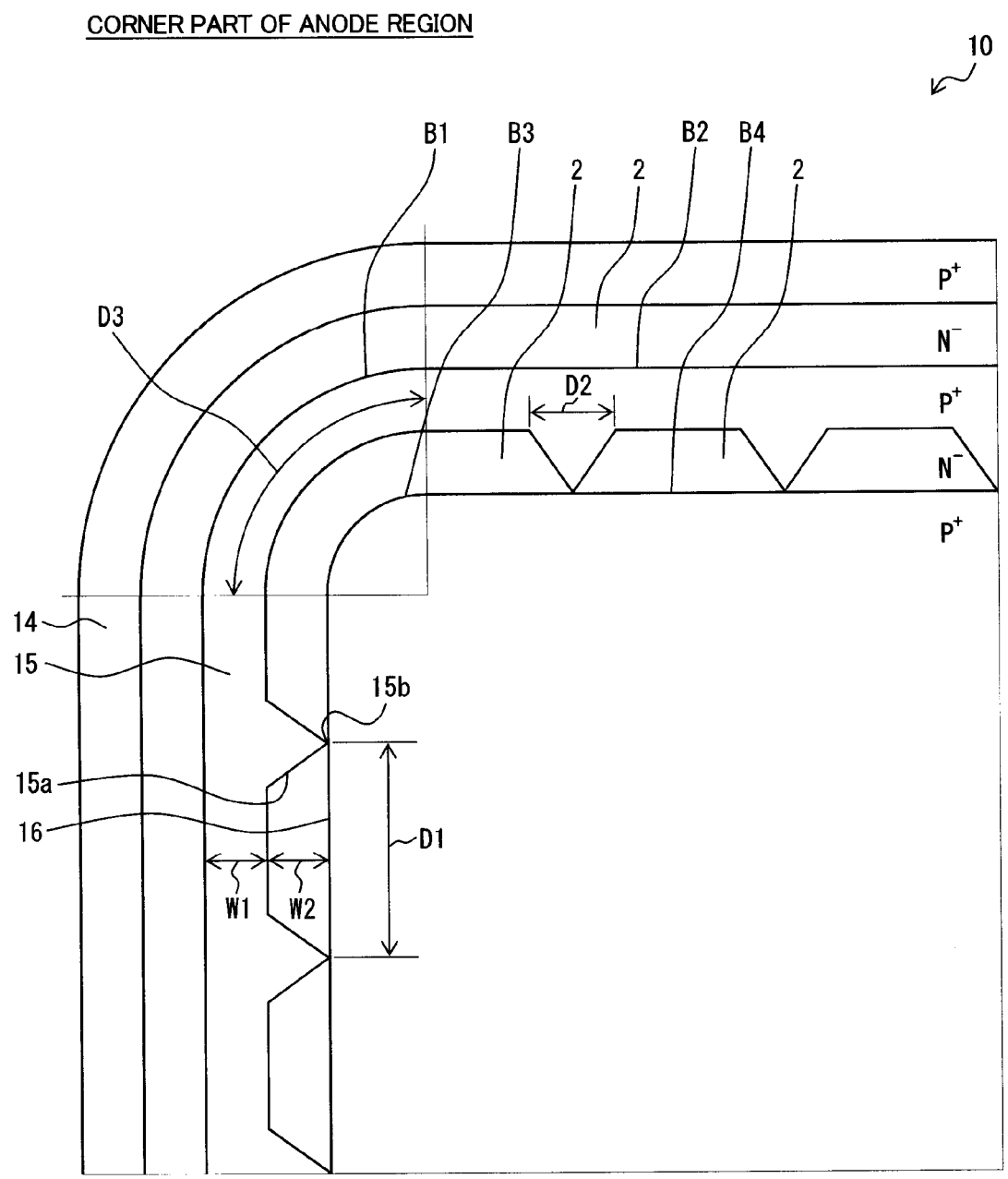
FIG. 4 is a plan view illustrating a configuration example in a main part of a PIN diode 10 in FIG. 1.

FIG. 4 is an enlarged view illustrating an enlarged main part of the PIN diode 10 in FIG. 1, in which one of the corner parts B1 of the separated anode region 15 and its periphery are illustrated with the oxide film 13 and anode electrode 17 being omitted. The main anode region 16 is adapted to have, as the outer edge thereof, the substantially rectangular shape having the arc-like curved parts B3 and the linear parts B4 adjacent to the curved parts B3. Here, a rectangular shape of which four corners are chamfered is referred to as the substantially rectangular shape. The linear parts B4 are border lines having curvature=0, whereas the curved parts B3 are border lines that vary with constant curvature that is not 0, and formed at the four corners of the main anode region 16.

The separated anode region 15 is formed between an inner edge of the FLR 14 arranged innermost and the outer edge of the main anode region 16, and an annular region having substantially the same width. Each of the protruding parts 15a is formed in a location other than the corner parts B1 of the separated anode region 15. That is, each of the protruding parts 15a is formed in any of the linear parts B2 of the separated anode region 15. Also, each of the protruding parts 15a is arranged in a location that is sufficiently distant from any of the corner parts B1 of the separated anode region 15. The respective protruding parts 15a are formed with the connecting parts 15b that connect to the main anode region 16.

A distance from the center of any of the corner parts B1 to a corresponding one of the nearest protruding parts 15a is determined depending on an arc length D3 of the corner part B1 and a required resistance value. For example, assuming that the width W1 of the separated anode region 15 is W1=10 μm, and a resistance value of a path along the separated anode region 15 is 2 kΩ, the nearest protruding part 15a is arranged in a sufficiently distant location that is at the distance of approximately 100 μm.

Each of the four linear parts B2 of the separated anode region 15 is formed with the two or more protruding parts 15a, and a distance D1 between connecting parts 15b of any adjacent protruding parts 15a is constant. For example, D1=approximately 100 μm. The number of the protruding parts 15a arranged in one of the linear parts B2 is determined depending on a length of the linear parts B4 of the main anode region 16.

Each of the protruding parts 15a is adapted to have the shape of which a width is narrowed depending on a distance from the inner edge of the separated anode region 15. For example, the shape is a triangular shape of which a length parallel to a corresponding one of the linear parts B4 of the main anode region 16 is monotonously decreased depending on the distance from the separated anode region 15. That is, each of the protruding parts 15a is adapted such that a width of a corresponding one of the connecting parts 15b is narrow as compared with a width D2 of an end part on the separated anode region 15 side. In addition, the outer shape of each of the protruding parts 15a may be sawtooth or arc-like. If as the shape of each of the protruding parts 15a, a shape of which a width is narrowed from one side toward the other side is used, mask-based patterning is easy, and a connecting area of each of the connecting parts 15b can be decreased to thereby easily increase a resistance value.

In this example, each of the protruding parts 15a is adapted to have an isosceles triangular shape of which an apex is a corresponding connecting part 15b, and the connecting part 15b is in a point contact with a corresponding linear part B4 of the main anode region 16. As an apex angle of the protruding part 15*a*, in order to prevent defective exposure and development of a resist pattern for selectively diffusing the impurities, an angle larger than an acute angle, for example, a right angle may be selected. Assuming that a distance between the inner edge of the separated anode region 15 and the outer edge of the main anode region 16 is W2, the width D2 is D2=approximately W2×2. The width D2 is sufficiently small as compared with the distance D1.

<Avalanche Breakdown in Corner Part>

Figure 5:
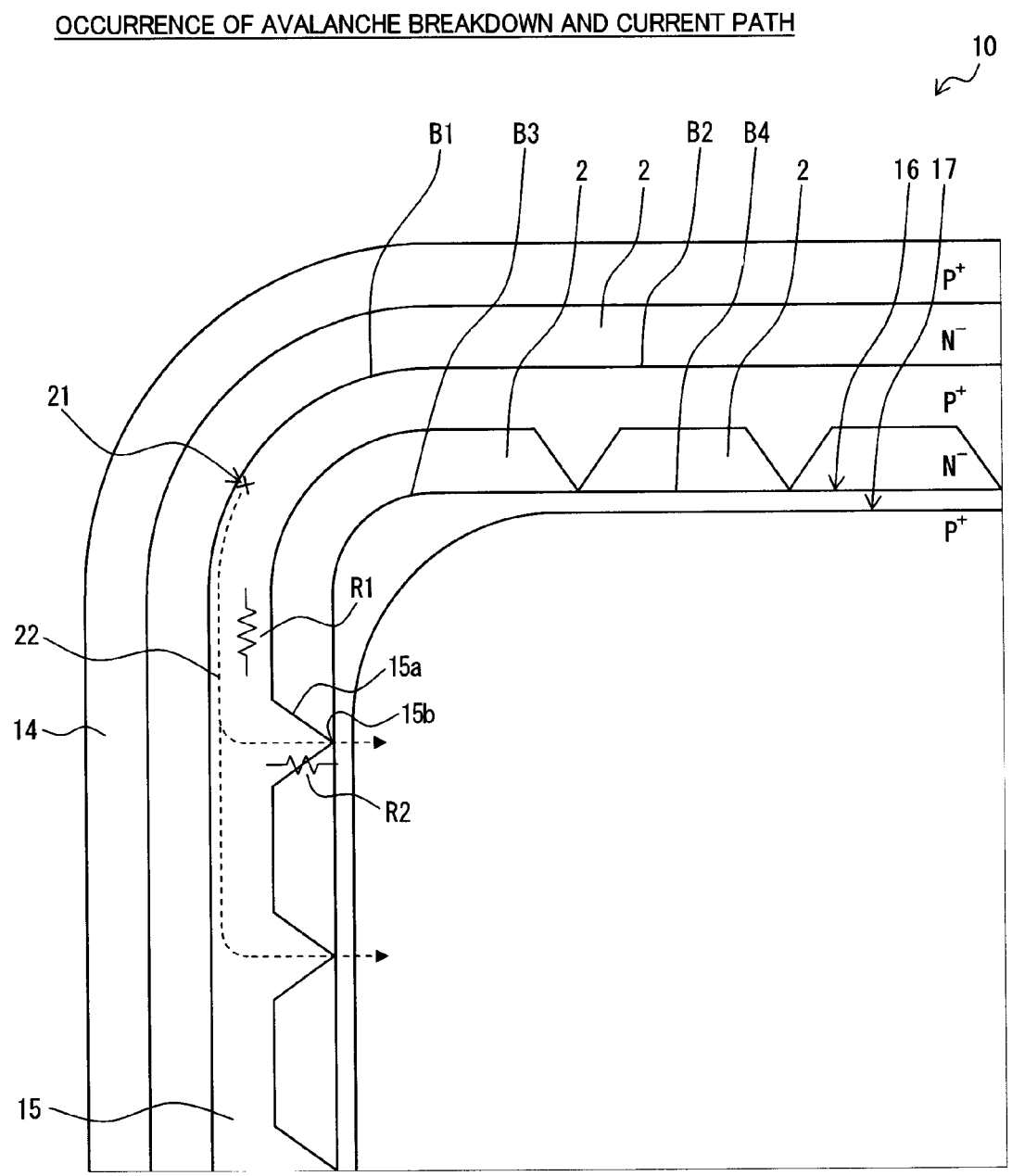
FIG. 5 is an explanatory diagram schematically illustrating an example of operation of the PIN diode 10 in FIG. 1.

FIG. 5 is an explanatory diagram schematically illustrating an example of operation of the PIN diode 10 in FIG. 1, in which current paths for the case where avalanche breakdown occurs in one of the corner parts B1 of the separated anode region 15 are illustrated. Note that, in this diagram, the oxide film 13 is omitted. In general, the avalanche breakdown occurs from a location where an electric field is most concentrated in an element.

In the case of the PIN diode 10 having the rectangular shaped anode region, an electric field is most likely to be concentrated in any of the corner parts B1 of the separated anode region 15, and in any of the linear parts B2 of the separated anode region 15, an electric field is likely to be concentrated after the corner parts B1. In the main anode region 16, as compared with the corner parts B1 and linear parts B2 of the separated anode region 15, an electric field is unlikely to be concentrated.

In the PIN diode 10, the main anode region 16 and the separated anode region 15 are conducted to each other through the protruding parts 15*a*, so that these regions are at the same potential, and in any of the corner parts B1 of the separated anode region 15, first avalanche breakdown occurs. In the case where the avalanche breakdown occurs in any of the corner parts B1 of the separated anode region 15, avalanche current 22 that flows from a location 21 of the breakdown to the anode electrode 17 cannot linearly flow from the breakdown location 21 toward the main anode region 16 because between the separated anode region 15 and the main anode region 16, the N⁻ semiconductor layer 2 having low impurity concentration intervenes.

For this reason, the avalanche current 22 flows along the separated anode region 15, and flows into the main anode region 16 through connecting parts 15*b* of corresponding protruding parts 15*a*. In one of the linear parts B2 of the separated anode region 15, the plurality of protruding parts 15*a* are arranged, and therefore the avalanche current that flows along the separated anode region can be distributed to the respective anode connecting regions. If the avalanche current 22 flows through such paths, a resistance component (R1+R2) of one of the paths gives rise to a voltage drop to increase a potential at the breakdown location 21, and therefore the breakdown location moves to a lower potential site. For example, the breakdown location moves to any of the linear parts B2 of the separated anode region 15. The breakdown location moves in this manner, so that the location where the avalanche current 22 flows with being concentrated is distributed, and therefore the occurrence of thermal destruction of the element due to the concentration of the avalanche current can be suppressed.

The connecting parts 15*b* of the protruding parts 15*a* are adapted to have the shape of which the width is narrowed toward the main anode region 16, and therefore conducted to the main anode region 16 with being in near point contact with the main anode region 16, so that as compared with the resistance component R1 of the path along the separated anode region 15, the resistance component R2 associated with a corresponding anode connecting region is sufficiently large.

Figure 6:
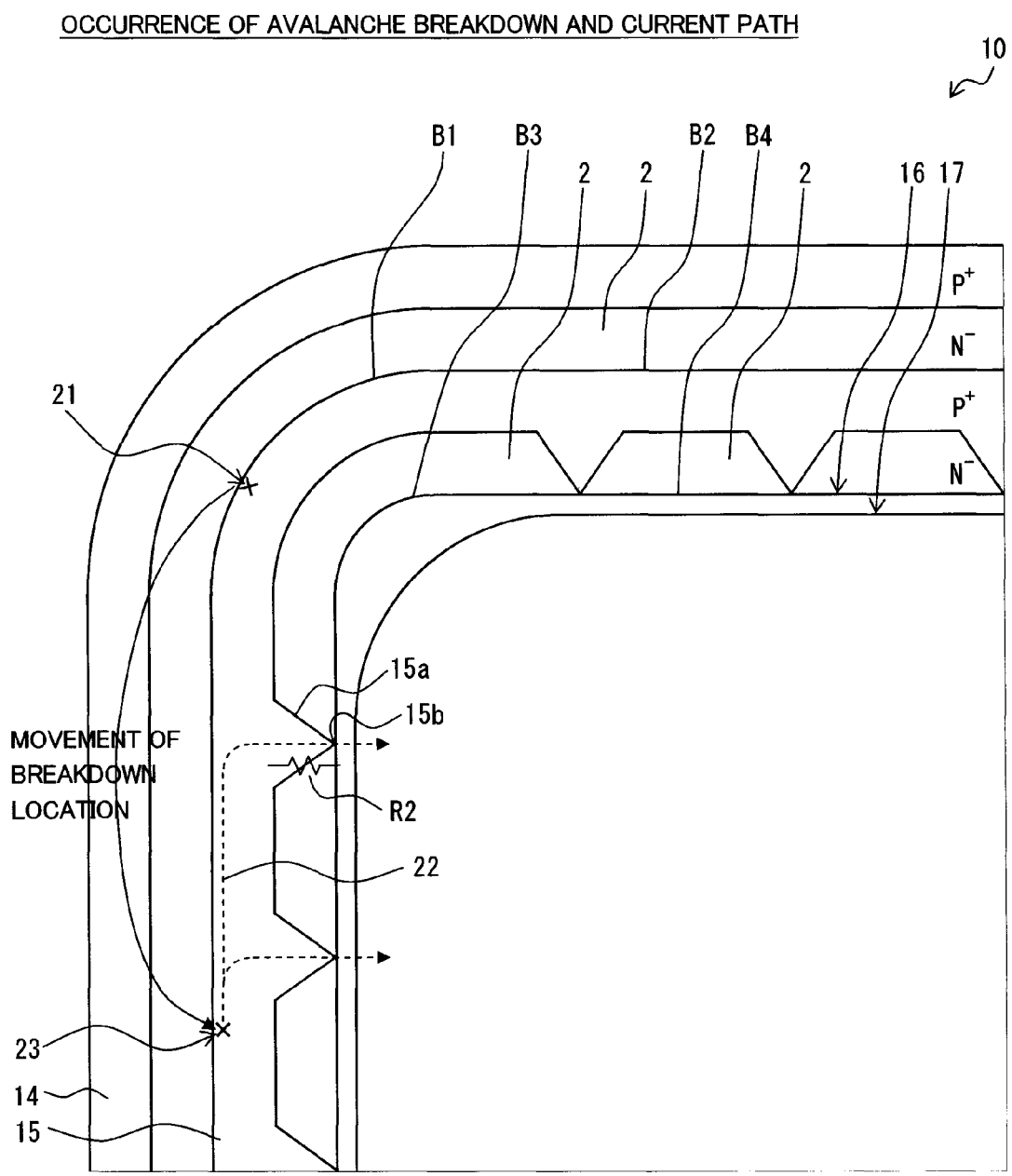
FIG. 6 is a diagram illustrating a current path for the case where a breakdown location moves from a state in FIG. 4 onto a linear part B2 of a separated anode region 15.

FIG. 6 is a diagram illustrating a current path for the case where, from a state illustrated in FIG. 5, the breakdown location moves onto a corresponding linear part B2 of the separated anode region 15. In the case where the breakdown location moves from the corner part B1 of the separated anode region 15 to the linear part B2, avalanche current 22 can be flowed from a new breakdown location 23 to the respective protruding parts 15*a*. Also, a voltage drop caused by a resistance component of the current path increases a potential at the breakdown location 23, and thereby the movement of the breakdown location is repeated.

Next, an outline of a method for manufacturing such a PIN diode 10 is described. The N⁻ semiconductor layer 2 of the semiconductor substrate 11 is formed by epitaxially growing an N-type semiconductor layer having low impurity concentration on an N⁺ semiconductor layer 1 containing N-type impurities such as phosphorous (P), arsenic (As), or antimony (Sb). Note that the semiconductor substrate 11 may be one that is prepared by diffusing N-type impurities into the N⁻ semiconductor layer 2 to form the N⁺ semiconductor layer 1.

The main anode region 16, separated anode region 15, protruding parts 15*a*, and FLRs 14 are patterned by forming a resist film including photoresist on the semiconductor substrate 11, and using a common photomask to expose and develop the resist film.

Then, the main anode region 16, separated anode region 15, protruding parts 15*a*, and FLRs 14 are formed by diffusing P-type impurities such as boron (B) or indium (In) from an exposed region on an outer surface of the N⁻ semiconductor layer 2. Regarding the cathode electrode 18 or anode electrode 17, for example, on a corresponding surface of the semiconductor substrate 11, electrically conductive metal is evaporated. The electrode is then formed by using a resist pattern to selectively remove a metal film formed by the evaporation.

That is, the main anode region 16, separated anode region 15, and plurality of FLRs 14, and the anode connecting regions that connect the separated anode region 15 and the main anode region 16 to each other can be simultaneously formed by one impurity diffusion process in such a way as to use the one photomask to pattern the resist film, and diffuse the P-type impurities. Accordingly, the multiple diffusion process and ion implantation process as in the above-described conventional technique are not separately required, and therefore as compared with a conventional element, without reducing productivity, avalanche resistance can be improved at low cost.

Figure 7:
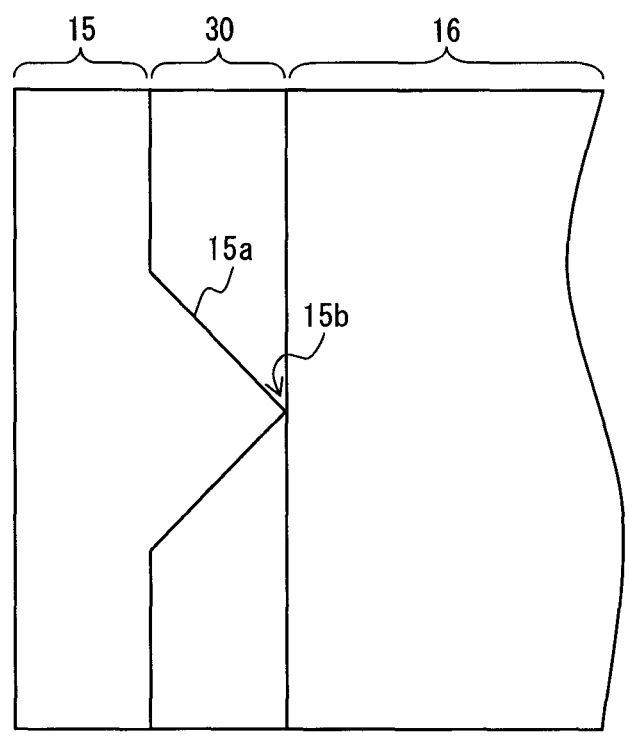
FIG. 7 is an explanatory diagram schematically illustrating a method for manufacturing the PIN diode 10 in FIG. 1.

FIG. 7 is an explanatory diagram schematically illustrating an example of the method for manufacturing the PIN diode 10 in FIG. 1, in which a process of arranging a mask pattern 30 having the shape of the protruding parts 15*a* to form the separated anode region 15, protruding parts 15*a*, and main anode region 16 is illustrated.

The separated anode region 15, protruding parts 15*a*, and main anode region 16 are formed by selectively diffusing the P-type impurities from the surface of the N⁻ semiconductor layer 2. That is, these anode regions are formed by arranging the mask pattern 30 that has the shape of the protruding parts 15*a* between the separated anode region 15 and the main anode region 16 that are desired to be prepared, and diffusing the P-type impurities.

In this case, it is only necessary to pattern the same shapes as those of the separated anode region 15, protruding parts 15*a*, and main anode region 16, which are desired to be prepared, in the same locations as those of them, and therefore a shape of the connecting parts 15b can be accurately controlled to finely adjust a value of the resistance component R2 with ease.

According to the present embodiment, if avalanche breakdown occurs in any of the corner parts B1 of the separated anode region 15, avalanche current flows along the separated anode region 15, and turns toward corresponding protruding parts 15a, so that a potential at a breakdown location is increased by a resistance component of a path, and therefore the breakdown location moves to a lower potential site. The breakdown location moves in this manner, so that the location where the avalanche current flows with being concentrated and thereby temperature is raised is distributed, and therefore the occurrence of thermal destruction of the element can be suppressed. Accordingly, the corner part of the anode region can be suppressed from being thermally destroyed by the concentration of the avalanche current, and therefore avalanche resistance can be improved.

In particular, the protruding parts 15a are adapted to have the shape of which the width is narrowed with distance from the inner edge of the separated anode region 15, so that a resistance component at the time when the avalanche current flows to the main anode region 16 through a connecting part 15b of a protruding part 15a is increased, and therefore a voltage drop can be effectively produced.

Also, the plurality of protruding parts 15a are arranged for each of the linear parts B4 of the main anode region 16, and therefore the avalanche current flowing along the separated anode region 15 can be distributed to the respective protruding parts 15a. Further, the distance D1 between any adjacent protruding parts 15b is constant, so that in the case where due to the increase in potential at the breakdown location, the breakdown location moves from the corner part B1 of the separated anode region 15 to a corresponding linear part B2, the avalanche current can be equally flowed to the main anode region 16 from the new breakdown location through corresponding connecting parts 15b.

Further, at the time of patterning the resist film for selectively diffusing the impurities, the common mask can be used to form the main anode region 16, separated anode region 15, protruding part 15a, and FLRs 14, and therefore productivity can be improved. That is, the main anode region 16, separated anode region 15, anode connecting regions, and FLRs 14 can be simultaneously formed by the one impurity diffusion process in such a way as to use the one photomask to pattern the resist film, and diffuse the P-type impurities. Accordingly, the multiple diffusion process and ion implantation process as in the above-described conventional technique are not separately required, and therefore as compared with a conventional element, without reducing productivity, the avalanche resistance can be improved at low cost.

Note that, in the present embodiment, described is the example of the case where as each of the protruding parts 15a that connect the separated anode region 15 and the main anode region 16 to each other, the isosceles triangular shaped protruding part 15a is formed by protruding the inner edge of the separated anode region 15; however, the present invention is not limited to this. For example, as such an anode connecting region, each of the linear parts B4 of the main anode region 16 may be protruded, or in both of the separated anode region 15 and the main anode region 16, protruding parts may be respectively provided so as to face to each other.

Figure 8:
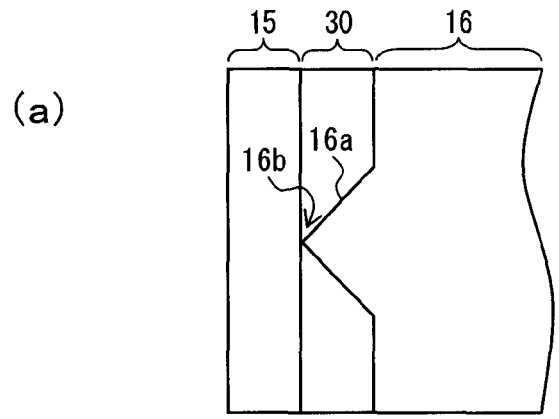
FIG. 8 is a diagram illustrating a configuration example of a PIN diode 10 according to a second embodiment of the present invention.
Figure 8:
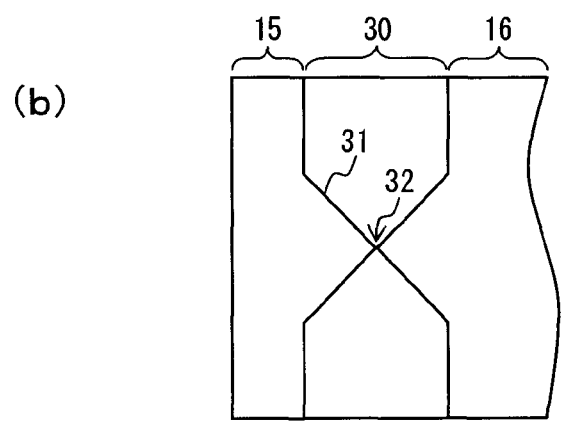
Figure 8:
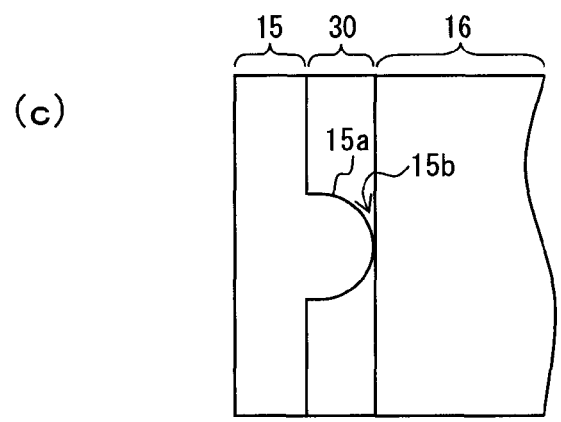

FIGS. 8 (a) to (c) are diagrams each illustrating a configuration example of a PIN diode 10 according to a second embodiment of the present invention, in which another shape of the separated anode region 15 and another shape of the main anode region 16 are illustrated. FIG. 8 (a) illustrates a case of providing a protruding part 16a formed by protruding each of the linear parts B4 of the main anode region 16. The protruding part 16a is adapted to have a triangular shape of which a width is narrowed as a distance from the linear part B4 of the main anode region 16 increases. The anode region 16 is conducted to the separated anode region 15 through a connecting part 16b formed at a fore end of the protruding part 16a.

FIG. 8 (b) illustrates a case of providing protruding parts 31 in both of the separated anode region 15 and the main anode region 16 such that the protruding parts 31 face to each other. In this example, the protruding part 31 formed by protruding the inner edge of the separated anode region 15 and the protruding part 31 formed by protruding a corresponding linear part B4 of the main anode region 16 are formed. At fore ends of the respective protruding parts 31, connecting parts 32 are formed, and at the connecting parts 32, both of the regions are in point contact with each other.

FIG. 8 (c) illustrates a case of providing a circular shaped protruding part 15a by protruding the inner edge of the separated anode region 15. The protruding part 15a is, as in the case of the isosceles triangular shaped protruding part 15a, also adapted to have a shape of which a width is narrowed as a distance from the inner edge of the separated anode region 15 increases. Even in such a configuration, a resistance component at the time when avalanche current flows to the main anode region 16 through the connecting part 16b, 32, or 15b is increased, and therefore a voltage drop can be effectively produced. The shape of the protruding part 15a is adapted such that the width thereof is narrowed as the distance from the inner edge of the separated anode region 15 increases, so that the protruding part 15a can be easily formed with use of a mask, and a connecting area can be decreased to easily increase the resistance component R2.

Second Embodiment

In the first embodiment, described is the example of the case of patterning the same shapes as those of the separated anode region 15, protruding parts 15a, and main anode region 16, which are desired to be prepared, in the same locations as those of them, and thereby accurately controlling the shape of the connecting parts 15b. On the other hand, in the present embodiment, a case of using lateral diffusion to form a protruding part 15a is described.

Figure 9:
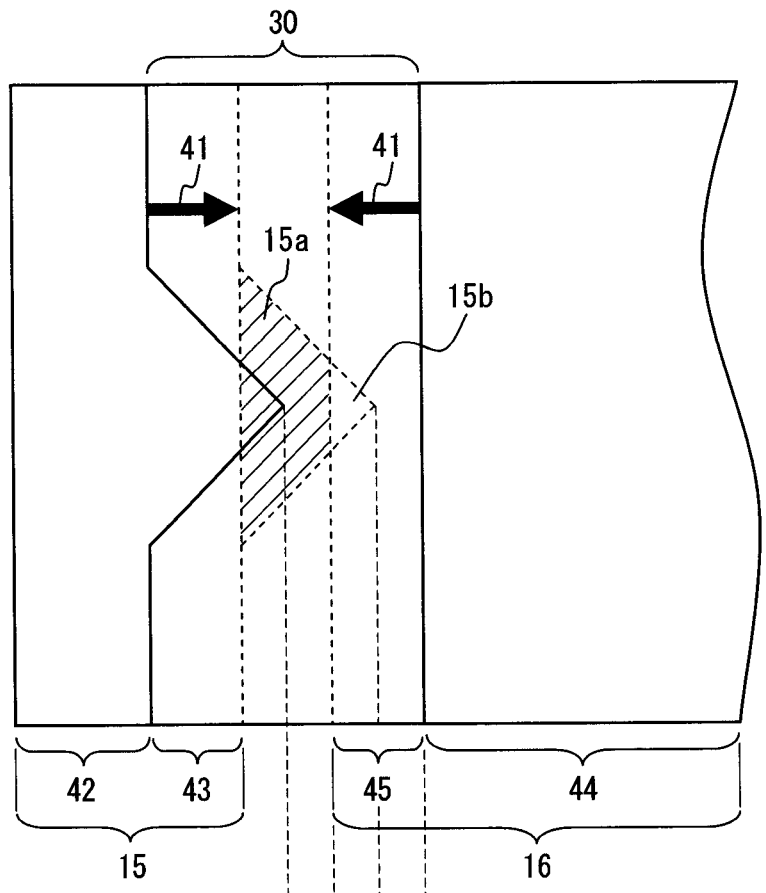
FIG. 9 is a diagram illustrating an example of a method for manufacturing the PIN diode 10 according to the second embodiment of the present invention.
Figure 9:
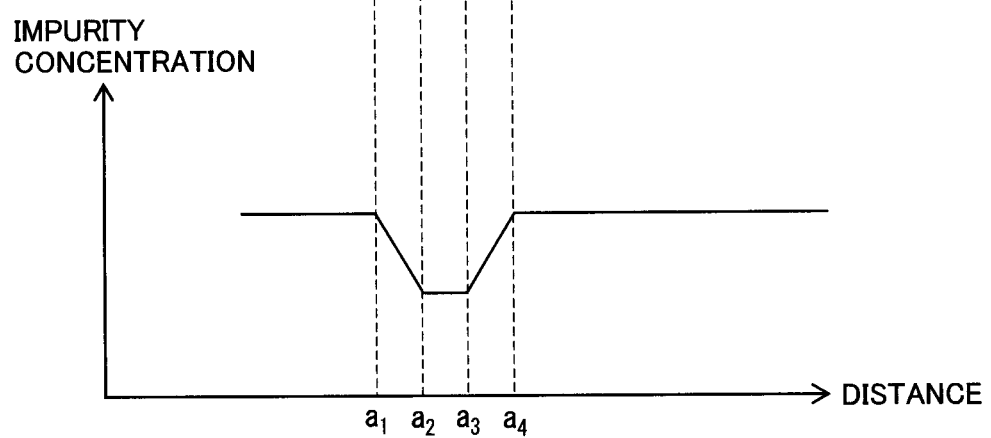

FIGS. 9 (a) and (b) are explanatory diagrams schematically illustrating an example of a method for manufacturing a PIN diode 10 according to the second embodiment of the present invention, in which a process of using diffusion toward lateral directions 41 to form a separated anode region 15, protruding part 15a, and main anode region 16 is illustrated. FIG. 9 (a) illustrates a shape of a mask pattern 30 at the time of forming the separated anode region 15 and main anode region 16. FIG. 9 (b) illustrates a concentration gradient that is formed on a current path from the separated anode region 15 to the main anode region 16 through the protruding part 15a.

The separated anode region 15, protruding part 15a, and main anode region 16 are formed by selectively diffusing P-type impurities from a surface of an N⁻ semiconductor layer 2. Impurity diffusion includes: diffusion that proceeds in a thickness direction of a semiconductor layer; and diffusion that, on the basis of thermal diffusion, proceeds in lateral directions 41 parallel to a surface of the semiconductor layer. Here, the impurity diffusion toward the lateral directions 41 based on the thermal diffusion is used to conduct a connecting part 15b to the main anode region 16.

The separated anode region 15, protruding part 15a, and main anode region 16 are formed by arranging the mask pattern 30 having a shape of the protruding part 15a between the separated anode region 15 and the main anode region 16, which are desired to be prepared, and diffusing the P-type impurities. As illustrated in FIG. 9 (a), before the impurity diffusion, exposed regions 42 and 44 that are unmasked are separated from each other; however, regarding these regions, the impurities diffuse in the lateral directions 41 to thereby connect the connecting pat 15b and the main anode region 16 to each other.

In the case of using the diffusion toward the lateral directions 41 as described, a region in which the exposed region 42 and a diffusion region 43 are combined serves as the actual separated anode region 15, and in the same manner, a region in which the exposed region 44 and a diffusion region 45 are combined serves as the actual main anode region 16. In this example, both of the diffusion regions 43 and 45 overlaps with each other by approximately halves from the both sides, and therefore the connecting part 15b overlaps with the main anode region 16. Accordingly, a planar shape of the protruding part 15a becomes a trapezoidal shape, and therefore the connecting part 15b and the main anode region 16 are connected to each other with having a width having a sufficiently large resistance component.

By using the lateral diffusion as described, accuracy of the mask pattern 30 is not required to be so high, and accuracy of a manufacturing process is also only required to be the same as before, so that the separated anode region 15, protruding part 15a, and main anode region 16 can be easily manufactured.

Note that, regarding impurity concentration on the outer surface of the N⁻ semiconductor layer 2, on a current path from the separated anode region 15 to the main anode region 16 through the protruding part 15a, a concentration gradient that minimizes the impurity concentration is formed. That is, as illustrated in FIG. 9 (b), on the current path, the impurity concentration is monotonously decreased as a distance from a fore end $a_1$ of the exposed region 42 increases; in the connecting part 15b from a distance $a_2$ to a distance $a_3$, minimized; and then until the distance reaches the exposed region 44 at a distance $a_4$, monotonously increased. Such a concentration gradient is formed by making the exposed regions 42 and 44 of the N⁻ semiconductor layer 2 discontinuous at the time of the impurity diffusion.

According to the present embodiment, the resistance component at the time when avalanche current turns from the separated anode region 15 toward the connecting part 15b is increased, and therefore a voltage drop can be effectively produced. In particular, the resistance component is increased by the concentration gradient, and therefore without increasing patterning accuracy at the time of the impurity diffusion, the desired resistance component can be obtained.

Note that, in the present embodiment, described is the example of the case where, as the protruding part 15a that connects the separated anode region 15 and the main anode region 16 to each other, the isosceles triangular shaped protruding part 15a is formed in the separated anode region 15; however, the present invention is not limited to this. For example, as such an anode connecting region, a protruding part may be provided in the main anode region 16, or protruding parts may be provided in both of the separated anode region 15 and the main anode region 16 so as to face to each other.

Figure 10:
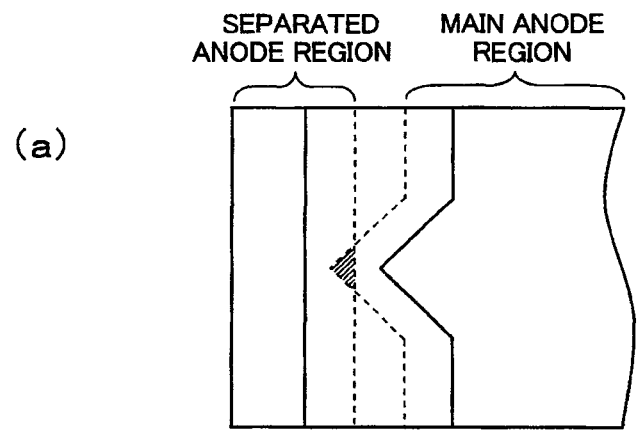
FIG. 10 is a diagram illustrating another configuration example of the PIN diode 10 according to the second embodiment of the present invention.
Figure 10:
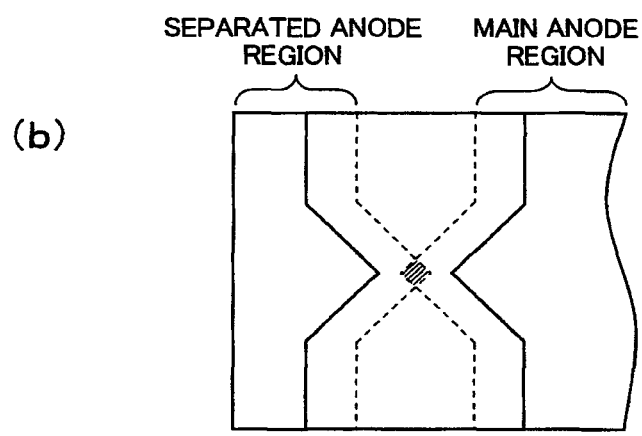
Figure 10:
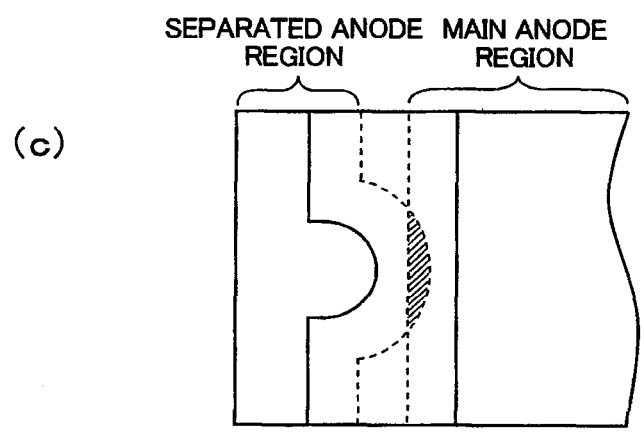
Figure 11:
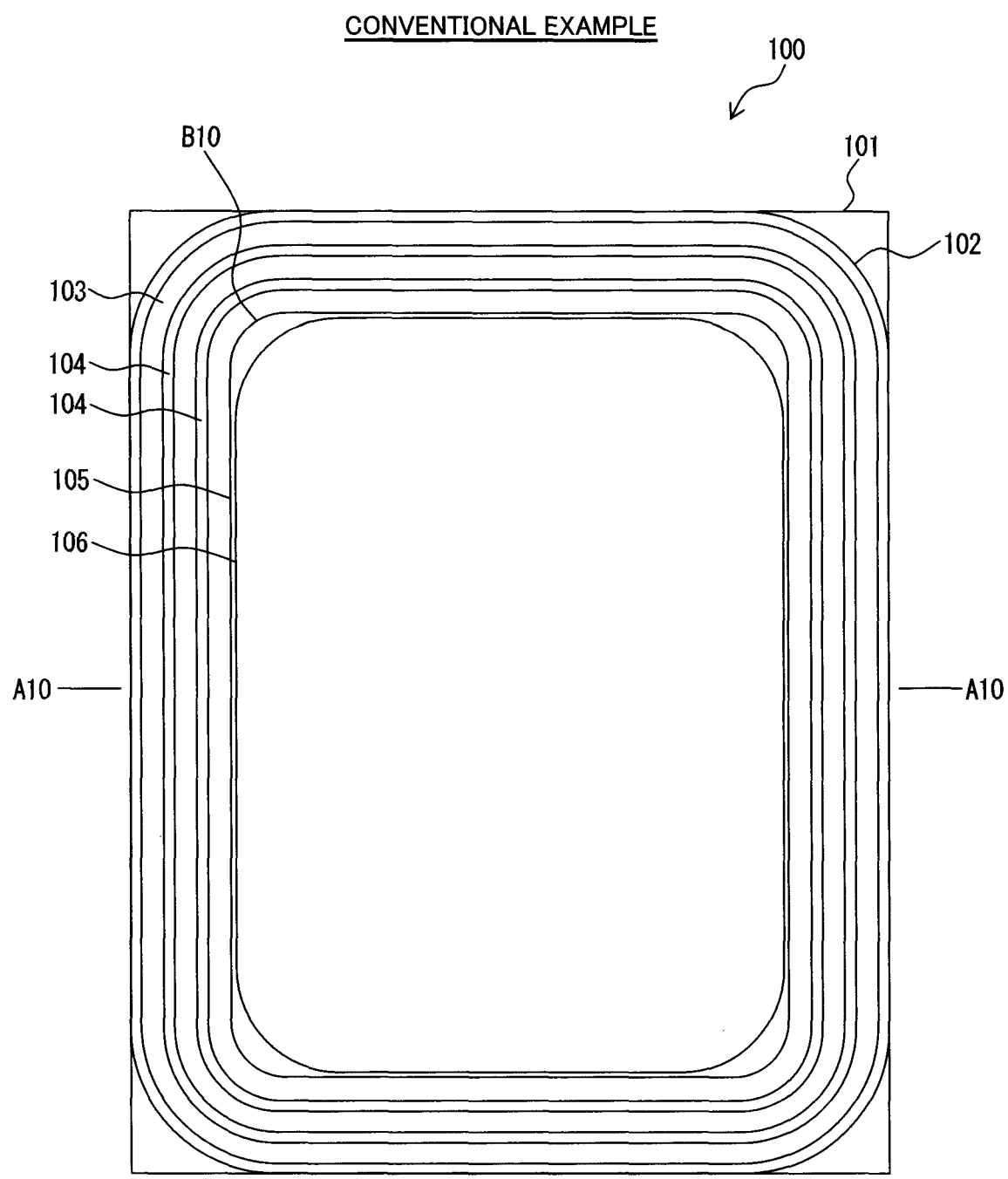
FIG. 11 is a plan view illustrating a conventional PIN diode 100 in which a plurality of FLRs 104 surrounding an anode region 105 are formed.
Figure 12:
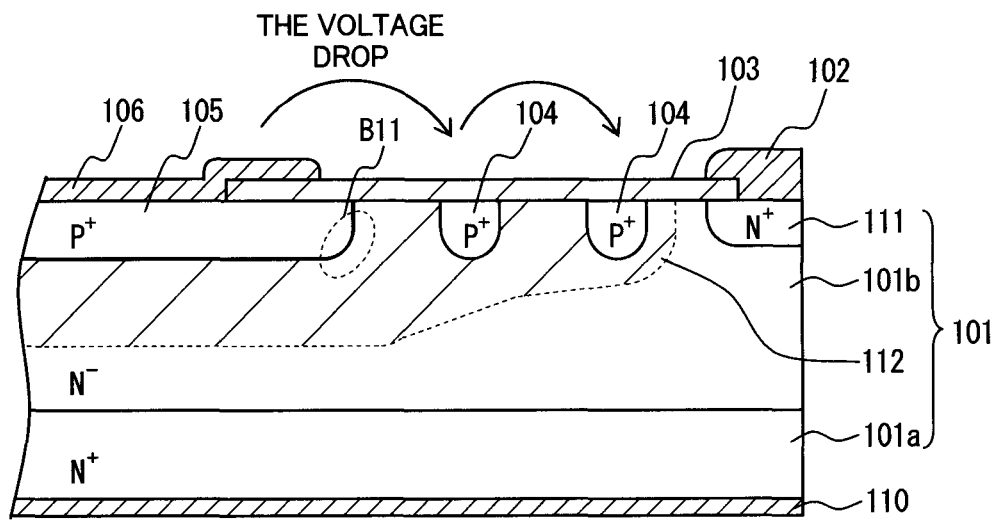
FIG. 12 is a cross section cut by an A10-A10 section line in FIG. 11.
Figure 13:
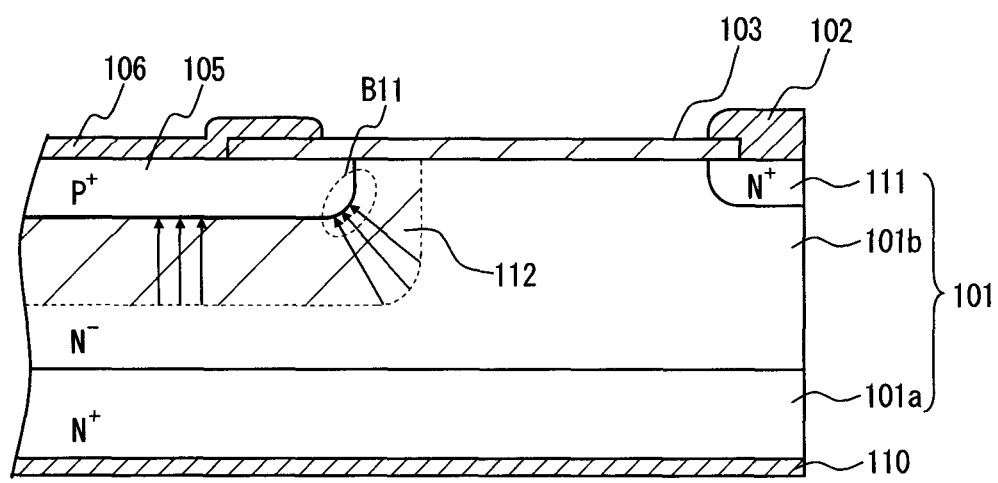
FIG. 13 is a cross sectional view of the conventional PIN diode without any FLR 104.

FIGS. 10 (a) to (c) are plan views each illustrating another configuration example of the PIN diode 10 according to the second embodiment of the present invention. As compared with the PIN diode 10 in FIG. 9, shapes of the separated anode region 15 and main anode region 16 are different. FIG. 10 (a) illustrates a case of providing a protruding part in a linear part B4 of the main anode region 16. The protruding part is adapted to have a shape of which a width is narrowed toward the separated anode region 15 from the main anode region 16, and in a lateral diffusion region, in contact with the separated anode region 15.

FIG. 10 (b) illustrates a case of providing protruding parts in both of the separated anode region 15 and the main anode region 16 such that the protruding parts face to each other. In this example, in a lateral diffusion region, the respective protruding parts are in contact with each other. That is, in an anode connecting region including these protruding parts, a concentration gradient that provides a local minimum point of impurity concentration is formed on a current path from the separated anode region 15 to the main anode region 16 through the anode connecting region.

FIG. 10 (c) illustrates a case of providing a circular shaped protruding part in the separated anode region 15. This protruding part is, as in the case of the isosceles triangular shaped protruding part 15a, also adapted to have a shape of which a width is narrowed toward the main anode region 16 from the separated anode region 15, and in contact with the main anode region 16 in a lateral diffusion region.

Also, in the present embodiment, described is the example of the case where as an anode region terminal structure, a plurality of FLRs 14 are formed; however, the present invention is not limited to this. For example, in order to increase breakdown voltage, a SIPOS layer may be formed outside the separated anode region 15. The SIPOS (Semi-Insulating Polycrystalline Silicon) layer is a layer including a semi-insulating film in which oxygen is mixed in polycrystalline silicon, and movable carriers inside the SIPOS layer compensate a disturbance in electric field distribution, so that the breakdown voltage can be improved. Alternatively, a technique that combines: an FP (Field Plate) technique that by extending the anode electrode 17 toward an outer edge side of the semiconductor substrate 11 on the oxide film 13, improves breakdown voltage in an end part of the anode region; and the FLR is also included in the present invention.

This application claims priority under the Paris Convention based on the following patent application in Japan: the patent application filed on Feb. 17, 2010 (Japanese patent application No. 2010-031957), the entire content of which is incorporated herein by reference.

DESCRIPTION OF REFERENCE NUMERALS

1 N⁺ semiconductor layer
2 N⁻ semiconductor layer
3 stopper region
10 PIN diode
11 semiconductor substrate
12 equipotential electrode
13 oxide film
14 FLR
15 separated anode region
15a protruding part
15b connection part
16 main anode region
17 anode electrode
18 cathode electrode
B1 corner part of separated anode region
B2 linear part of separated anode region
B3 curved part of main anode region
B4 linear part of main anode region

What is claimed is:

1. A PIN diode comprising:
a semiconductor substrate that includes an N-type first semiconductor layer, and an N-type second semiconductor layer having lower impurity concentration than impurity concentration of the first semiconductor layer;
a cathode electrode that is formed on an outer surface of the first semiconductor layer;
a main anode region, a separated anode region, and an anode connecting region that are formed by selectively diffusing a P-type impurity from an outer surface of the second semiconductor layer; and
an anode electrode that is formed on said main anode region, wherein:
said main anode region has a substantially rectangular outer edge of which four sides are respectively adapted to be linear parts and four vertices are respectively adapted to be substantially arc-like curved parts;
said separated anode region is annularly formed along the outer edge of said main anode region; and
said anode connecting region is adapted to have a shape that is formed by protruding any one of an inner edge of said separated anode region and any of said linear parts to bring the any one into point contact with the other one, the inner edge and the linear parts facing each other.

2. The PIN diode according to claim 1, wherein
said anode connecting region is adapted to have a triangular shape having a width that is decreased depending on a distance from the any one of the inner edge of said separated anode region and the any of said linear parts.

3. The PIN diode according to claim 1, wherein
said anode connecting region has an arc-like outer shape having a width that is decreased depending on a distance from the any one of the inner edge of said separated anode region and the any of said linear parts.

4. The PIN diode according to claim 1, wherein
for each of said linear parts, two or more said anode connecting regions are arranged.

5. The PIN diode according to claim 1, wherein
a concentration gradient providing a local minimum point of impurity concentration is formed on a current path from said separated anode region to said main anode region through said anode connecting region, the impurity concentration is on the outer surface of the second semiconductor.

* * * * *